(12) United States Patent
Park et al.

(10) Patent No.: US 11,398,290 B2
(45) Date of Patent: Jul. 26, 2022

(54) STACKED MEMORY DEVICE AND MEMORY SYSTEM INCLUDING THE SAME

(71) Applicant: SK hynix Inc., Gyeonggi-do (KR)

(72) Inventors: Youngjun Park, Seoul (KR); Youngjun Ku, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 235 days.

(21) Appl. No.: 16/889,378

(22) Filed: Jun. 1, 2020

(65) Prior Publication Data

US 2021/0110880 A1 Apr. 15, 2021

(30) Foreign Application Priority Data

Oct. 11, 2019 (KR) .................. 10-2019-0126120

(51) Int. Cl.
*G11C 29/38* (2006.01)
*H01L 25/065* (2006.01)

(52) U.S. Cl.
CPC .......... *G11C 29/38* (2013.01); *H01L 25/0657* (2013.01); *H01L 2225/06513* (2013.01); *H01L 2225/06541* (2013.01); *H01L 2225/06596* (2013.01)

(58) Field of Classification Search
CPC ... G11C 29/38; G11C 29/12015; G11C 29/14; H01L 25/0652; H01L 2225/06513; H01L 2225/06541; H01L 2225/06596
See application file for complete search history.

(56) References Cited

U.S. PATENT DOCUMENTS

| 7,698,088 | B2 | 4/2010 | Sul et al. | |
| 8,804,264 | B1* | 8/2014 | Yeung | G11B 20/10481 360/53 |
| 2015/0310931 | A1* | 10/2015 | Lee | G11C 29/36 714/718 |
| 2015/0371692 | A1* | 12/2015 | Song | G11C 7/222 365/189.05 |

FOREIGN PATENT DOCUMENTS

| KR | 10-0721581 | 5/2007 |
| KR | 10-0894504 | 4/2009 |
| KR | 10-2020-0112040 A | 10/2020 |

* cited by examiner

*Primary Examiner* — Kyle Vallecillo
(74) *Attorney, Agent, or Firm* — IP & T Group LLP (57) ABSTRACT

A memory device including a data pad, and first and second data strobe pads, a data strobe signal generation circuit suitable for generating a read data strobe signal, outputting the read data strobe signal to the first data strobe pad, and generating an internal data strobe signal based on the read data strobe signal, during a test read operation, an input circuit suitable for feeding back and receiving data outputted to the data pad, during the test read operation, an alignment circuit suitable for aligning data received by the input circuit, based on the internal data strobe signal, and a test register circuit suitable for performing a preset operation on the data aligned by the alignment circuit and storing data obtained through the preset operation, wherein the test register circuit outputs the stored data to a read path during the test read operation.

20 Claims, 6 Drawing Sheets

STACKED MEMORY DEVICE AND MEMORY SYSTEM INCLUDING THE SAME

CROSS-REFERENCE TO RELATED APPLICATION

This application claims priority under 35 U.S.C. § 119 to Korean Patent Application No. 10-2019-0126120 filed on Oct. 11, 2019, which is incorporated herein by reference in its entirety.

BACKGROUND

1. Field

Various embodiments of the present disclosure relate to a semiconductor device, and more particularly, to a stacked memory device, and a memory system including the same.

2. Discussion of the Related Art

In order to satisfy demands for miniaturization and mounting reliability of semiconductor devices, a packaging technology for a plurality of semiconductor chips has been continuously developed. Particularly, as a semiconductor memory technology is rapidly developed, high integration and high performance are gradually required for a packaging technology of semiconductor memory chips. Therefore, beyond a two-dimensional structure, in which semiconductor memory chips are two-dimensionally disposed on a printed circuit board (PCB) by using wires and bumps, a variety of technologies related to a three-dimensional structure, in which a plurality of semiconductor memory chips are vertically stacked, are being developed.

As a stacked memory device having a three-dimensional structure is integrated and miniaturized, the size of a pad provided to a signal transfer port for communicating with a system is also decreasing. For example, the use of smaller pads, such as micro bumps, has made it difficult to directly test the pads by using pins of a test equipment.

Recently, a semiconductor device in the form of a system on chip (SOC), in which a memory device and a memory controller such as a CPU and a GPU are fabricated in a single package form, is mainly used. A pad of the memory device provided to such a semiconductor device may have a structure that is not exposed to the outside.

Therefore, the memory device may perform a test by using a separate pad provided for the test. In the memory device that is integrated and miniaturized, the number of test pads may be limited and a technology capable of testing the memory device by using a limited number of test pads is required.

SUMMARY

Various embodiments of the present disclosure are directed to a stacked memory device capable of feeding back data through read/write paths and testing circuits on the read/write paths by using the fed-back data, and a system including the same.

In an embodiment, a memory device may include: a data pad, and first and second data strobe pads; a data strobe signal generation circuit suitable for generating a read data strobe signal, outputting the read data strobe signal to the first data strobe pad, and generating an internal data strobe signal based on the read data strobe signal, during a test read operation; an input circuit suitable for feeding back and receiving data outputted to the data pad, during the test read operation; an alignment circuit suitable for aligning data received by the input circuit, based on the internal data strobe signal; and a test register circuit suitable for performing a preset operation on the data aligned by the alignment circuit and storing data obtained through the preset operation, wherein the test register circuit outputs the stored data to a read path during the test read operation.

In an embodiment, a stacked memory device may include: a core chip; and a base chip, wherein the base chip may include: a read control block suitable for outing data, which is received from the core chip, to a data pad; a test register circuit suitable for outputting stored data to the read control block during a test read operation; and a write control block suitable for feeding back data outputted from the read control block to the data pad and transmitting the fed-back data to the test register circuit, during the test read operation.

In an embodiment, a stacked memory device may include: a core chip; and a base chip, wherein the base chip may include: a read control block suitable for outputting data, which is received from the core chip, to a data pad; a data strobe signal generation circuit suitable for generating a read data strobe signal and generating an internal data strobe signal based on the read data strobe signal, during a test read operation; and a write control block suitable for feeding back data, which is outputted from the read control block to the data pad, and aligning the fed-back data based on the internal data strobe signal, during the test read operation.

In an embodiment, a method for testing a stacked memory device including a core chip having a data storage space, a data pad, a read path for transferring read data from the core chip to the data pad, and a write path for transferring write data from the data pad to the core chip may include: inputting a test data to the read path during a read test operation of the stacked memory device; transferring the test data passing through the read path to the write path via the data pad; receiving the test data passing through the write path; performing a preset operation on the received test data; comparing the test data subjected to the preset operation with a predetermined estimate; and determining whether or not the read path, the write path or the read and write paths are a fail, based on the comparison between the test data subjected to the preset operation and the predetermined estimate.

In accordance with the present technology, during a test operation, a memory device may feed back data through the read/write paths thereof. Furthermore, it is possible to perform an operation on the fed-back data and confirm an operation result through a test path of the memory device. Consequently, various circuits on the read/write paths of the memory device may be tested by using a limited number of test pads on the test paths.

Furthermore, it is possible to improve test operation efficiency of the memory device, to reduce the fabricating cost of the memory device.

These and other features and advantages of the present disclosure will become apparent to those skilled in the art of the invention from the following detailed description in conjunction with the following drawings.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Throughout the specification, when one element is referred to as being 'connected to' or 'coupled to' another element, it may indicate that the former element is directly connected or coupled to the latter element or electrically connected or coupled to the latter element with another element interposed therebetween. Furthermore, when an element "includes" or "comprises" a component, it means that the element does not exclude another component but may further include or comprise another component, unless referred to the contrary. Moreover, although components described in the specification are represented in a singular form, the present embodiment is not limited thereto, but the corresponding components may also be represented in a plural form.

Figure 1:
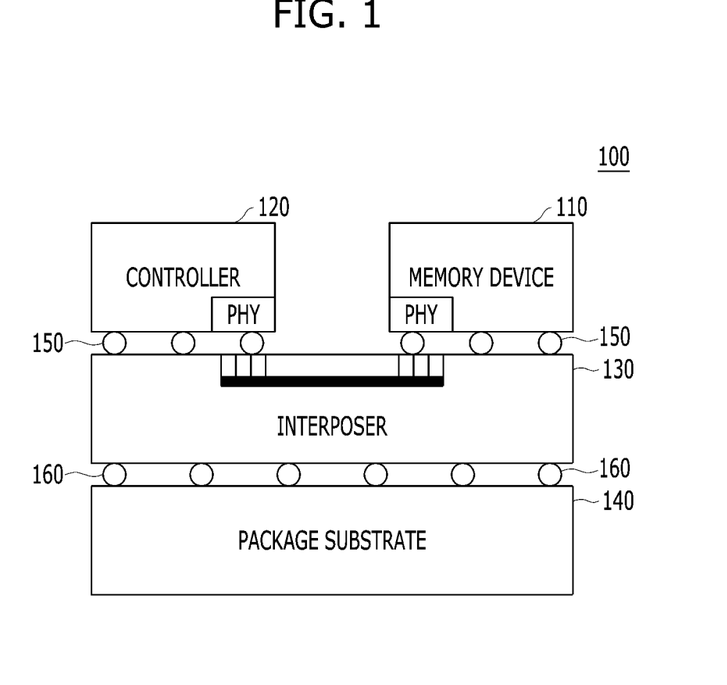
FIG. 1 is a diagram illustrating a semiconductor system in accordance with various embodiments of the present invention.

As illustrated in FIG. 1, a semiconductor system 100 in accordance with various embodiments of the present invention may have a system on chip (SOC) structure. The semiconductor system 100 may include a memory device 110, a controller 120, an interposer 130, and a package substrate 140.

The memory device 110 may be a volatile memory device such as a DRAM, or may be a nonvolatile memory device such as a FLASH memory device, a phase change memory device (PCRAM), a resistive memory device (ReRAM), a ferroelectric memory device (FeRAM), a magnetic memory device (MRAM), and a spin injection magnetic memory device (STTRAM). Alternatively, the memory device 110 may be composed of a combination of two or more of the volatile memory device and the nonvolatile memory device. In accordance with an embodiment, the memory device 110 may be a stacked memory device including a plurality of chips. The configuration of the memory device 110 will be described in more detail with reference to FIG. 2.

The controller 120 may include a central processing unit (CPU), a graphics processing unit (GPU), a digital signal processor (DSP), an application processor (AP), a controller chip, a memory controller chip and the like.

The memory device 110 and the controller 120 may be stacked on the interposer 130 and may be electrically connected to each other through micro bumps 150. The memory device 110 and the controller 120 may communicate with each other through a signal path formed in the interposer 130. That is, interfaces PHY of the memory device 110 and the controller 120 may be connected to each other through the interposer 130.

The interposer 130 may be stacked on the package substrate 140, and may be electrically connected through an electrical connection means 160 such as a bump ball and a ball grid array. Signal paths for transmitting signals may be formed in the interposer 130 and the package substrate 140.

Figure 2:
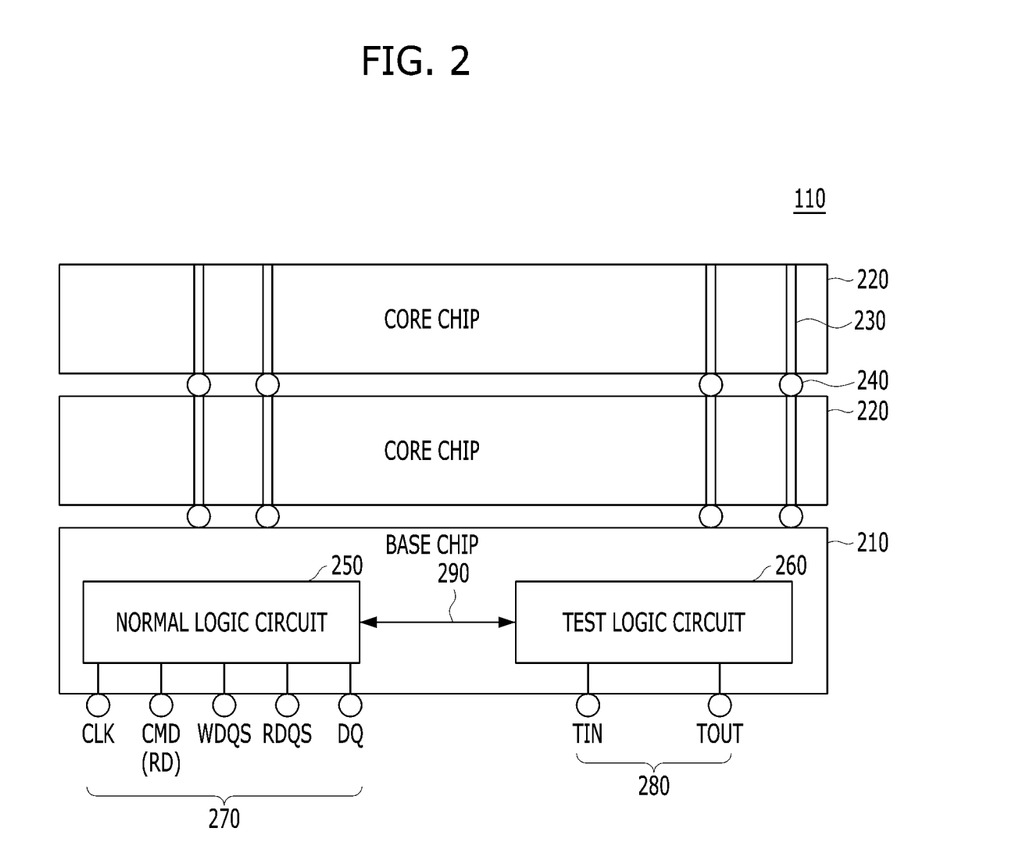
FIG. 2 is a diagram illustrating a memory device illustrated in FIG. 1 in accordance with various embodiments of the present invention.

FIG. 2 is a diagram illustrating the memory device 110 illustrated in FIG. 1 in accordance with various embodiments of the present invention. As illustrated in FIG. 2, the memory device 110 may include a base chip 210 and a plurality of core chips 220 stacked on the base chip 210.

The base chip 210 and the core chips 220 may be electrically connected to each other through through-silicon vias (TSVs) vertically penetrating the inside of the core chips 220, that is, through electrodes 230 and micro bumps 240, and may transmit/receive signals.

In the core chips 220, a data storage space, such as a memory cell array for storing data and a memory register, may be disposed. On the other hand, in the base chip 210, circuits for transmitting data between the core chips 220 and the controller 120 of FIG. 1 may be disposed. When the memory device 110 is configured in such a form, the number of input/output units may be greatly increased, which may be advantageous in increasing a bandwidth. An example of the memory device 110 configured in such a form may include a high bandwidth memory (HBM).

The base chip 210 in accordance with an embodiment may include a normal logic circuit 250 and a test logic circuit 260. The normal logic circuit 250 may include a circuit for controlling normal operations such as a write operation, a read operation, and a refresh operation of the memory device 110. The test logic circuit 260 may include a circuit for testing the memory device 110. The test logic circuit 260 may include various test operation-related circuits such as a built-in self-test circuit, a self-repair circuit, and a self-stress circuit.

The base chip 210 may further include a plurality of normal ports 270 and a plurality of test ports 280. The base chip 210 may transmit/receive various control signals required for the normal operations of the memory device 110 to/from the controller 120 through the plurality of normal ports 270. For example, the normal logic circuit 250 may transmit/receive a clock signal CLK, a command CMD, data strobe signals WDQS and RDQS, data DQ and the like through the plurality of normal ports 270.

The plurality of test ports 280 may be accessed directly and/or independently by another external device, such as a test equipment, regardless of the controller 120, and may receive various control signals TIN required for a test operation from the external device.

The test logic circuit 260 may allow the memory device 110 to perform the test operation based on the control signals TIN received through the plurality of test ports 280. The test logic circuit 260 may output a test operation result signal TOUT of the memory device 110 through at least one test port 280.

The test logic circuit 260 may generate signals, which are required for the test operation of the memory device 110, based on the control signals TIN received through the plurality of test ports 280, and transmit the generated signals to the normal logic circuit 250 through a test path 290. By so doing, the test logic circuit 260 may operate the normal logic circuit 250, and the memory device 110 may perform the test operation without the control of the controller 120. The test logic circuit 260 may receive a test operation result from the normal logic circuit 250 through the test path 290, and output the test operation result signal TOUT through the test port 280.

The plurality of normal ports 270 may include micro bump pads. The memory device 110 may communicate with the controller 120 through the plurality of normal ports 270. That is, the plurality of normal ports 270 may be connected to the controller 120 through the signal path formed in the interposer 130 of FIG. 1.

On the other hand, the plurality of test ports 280 may include a direct access pad. The memory device 110 may directly or independently communicate with the test equipment through the plurality of test ports 280.

Figure 3:
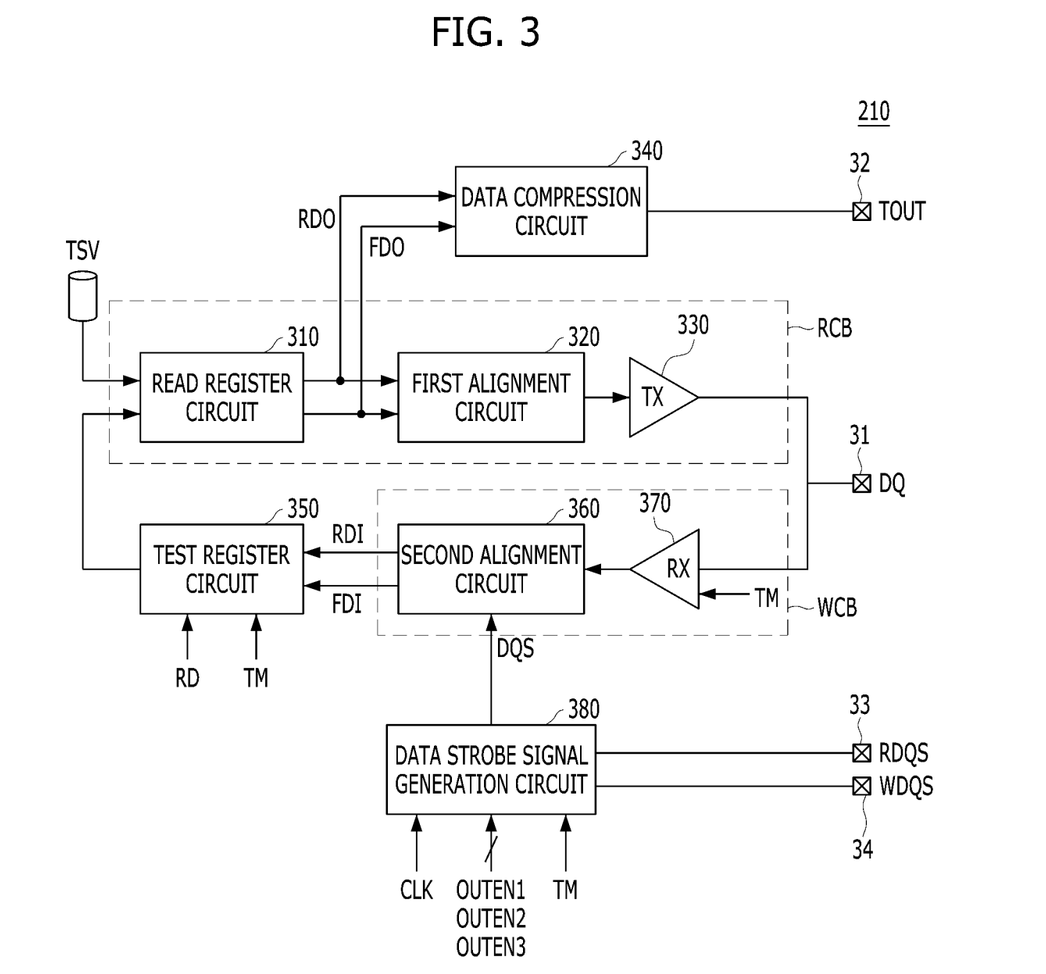
FIG. 3 is a diagram illustrating a base chip illustrated in FIG. 2 in accordance with various embodiments of the present invention.

FIG. 3 is a diagram illustrating the base chip 210 illustrated in FIG. 2 in accordance with various embodiments of the present invention. As described in FIG. 2, the base chip 210 may be electrically connected to the core chips 220 through the through electrodes (TSVs).

During a read operation, the base chip 210 may receive read data of the core chips 220 through the through electrodes (TSVs). The base chip 210 may include a read control block RCB on a read path and output the data received from the core chips 220 to a data pad 31. The read control block RCB may include a read register circuit 310, a first alignment circuit 320, and an output circuit 330.

The read register circuit 310 may store the read data outputted from the core chips 220 during the read operation. The read register circuit 310 may output the stored data as parallel data RD0 and FD0. The first alignment circuit 320 may serialize the parallel data RD0 and FD0, which are outputted from the read register circuit 310, based on the clock signal CLK. The first alignment circuit 320 may transmit the serialized data to the output circuit 330. The output circuit 330 may output the serialized data through the data pad 31 as read data DQ.

The base chip 210 may include a data compression circuit 340 for the test operation. In the test operation, the data compression circuit 340 may compress the parallel data RD0 and FD0 outputted from the read register circuit 310 to generate the test operation result signal TOUT. The data compression circuit 340 may output the test operation result signal TOUT to the outside through a test pad 32.

As described above, unlike the data pad 31, the test pad 32 may include pins or balls directly accessible by the external test equipment. Furthermore, since data compressed by the data compression circuit 340 is outputted, the test pad 32 may include a relatively smaller number of pins or balls than the data pad 31. By using the test pad 32, instead of the data pad 31, during the test operation, it is possible to improve test operation efficiency of the memory device 110.

However, when the test pad 32 is used during the test operation, defects of some circuits on the read path of the memory device 110, for example, the first alignment circuit 320 and the output circuit 330, may not be detected through the test operation. In addition, in order to match a speed of the test operation using the test pad 32 with a predetermined criterion, the position of an input terminal of the data compression circuit 340 may be limited on the read path.

In accordance with an embodiment of the present invention, the base chip 210 may include a test register circuit 350, a write control block WCB, and a data strobe signal generation circuit 380. The write control block WCB may include a second alignment circuit 360 and an input circuit 370 on a write path of the base chip 210.

During a write operation, the controller 120 of FIG. 1 may transmit write data DQ to the memory device 110. The input circuit 370 may receive the write data DQ transmitted from the controller 120 through the data pad 31. The second alignment circuit 360 may align data outputted from the input circuit 370, in parallel, based on an internal data strobe signal DQS. Data RDI and FDI aligned by the second alignment circuit 360 may be transmitted to the core chips 220 through the through electrodes (TSVs) via a write register circuit (not illustrated). That is, the write control block WCB on the write path may be used during a normal write operation, and a detailed description thereof will be omitted.

In accordance with an embodiment, during a test read operation, the test register circuit 350 may output data stored therein to the read path of the base chip 210, that is, the read control block RCB. When a test mode signal TM is activated and a read command RD is inputted, the test register circuit 350 may transmit initial data to the read register circuit 310.

In such a case, the read register circuit 310, the first alignment circuit 320, and the output circuit 330 included in the read control block RCB may perform the read operation according to the read command RD. That is, data outputted from the read register circuit 310 may be transmitted to the data pad 31 via the read control block RCB.

During the test read operation, the write control block WCB may feed back the data, which is outputted from the read control block RCB to the test register circuit 350. That is, when the test mode signal TM is activated during the test read operation, the input circuit 370 may be activated to feed the data DQ, which has been outputted to the data pad 31, back to the second alignment circuit 360.

The second alignment circuit 360 may align the data fed back by the input circuit 370, based on the internal data strobe signal DQS, and transmit the aligned data RDI and FDI to the test register circuit 350. As a consequence, the initial data stored in the test register circuit 350 may be transmitted to the data pad 31 via the read path according to the test read operation, and may be fed back again to the test register circuit 350.

The test register circuit 350 may have a storage space for storing data, and include a multiple input signature register (MISR). The test register circuit 350 may perform a preset operation on an inputted signal and store data obtained through the operation. Alternatively, the test register circuit 350 may compare an actual result of the preset operation performed on the inputted signal and a predetermined estimate to determine whether the test read operation result is a pass or a fail, and store the determination. Although not illustrated in FIG. 3, the test register circuit 350 may output the stored data to the outside through the test pad 32.

The base chip 210 may further include first and second data strobe pads 33 and 34. During the read operation, the data strobe signal generation circuit 380 may generate the read data strobe signal RDQS in response to the clock signal CLK and first to third output control signals OUTEN1 to OUTEN3 derived from the read command RD. The read data strobe signal RDQS may indicate information on an output time point of data and may be transmitted to the controller 120 through the first data strobe pad 33.

During the write operation, the data strobe signal generation circuit 380 may receive the write data strobe signal WDQS through the second data strobe pad 34. The data strobe signal generation circuit 380 may generate the internal data strobe signal DQS based on the write data strobe signal WDQS.

In accordance with an embodiment, during the test read operation, the data strobe signal generation circuit 380 may generate the read data strobe signal RDQS and output the generated read data strobe signal RDQS to the first data strobe pad 33. Furthermore, the data strobe signal generation circuit 380 may generate the internal data strobe signal DQS based on the generated read data strobe signal RDQS. The data strobe signal generation circuit 380 will be described in more detail with reference to FIG. 4.

Figure 4:
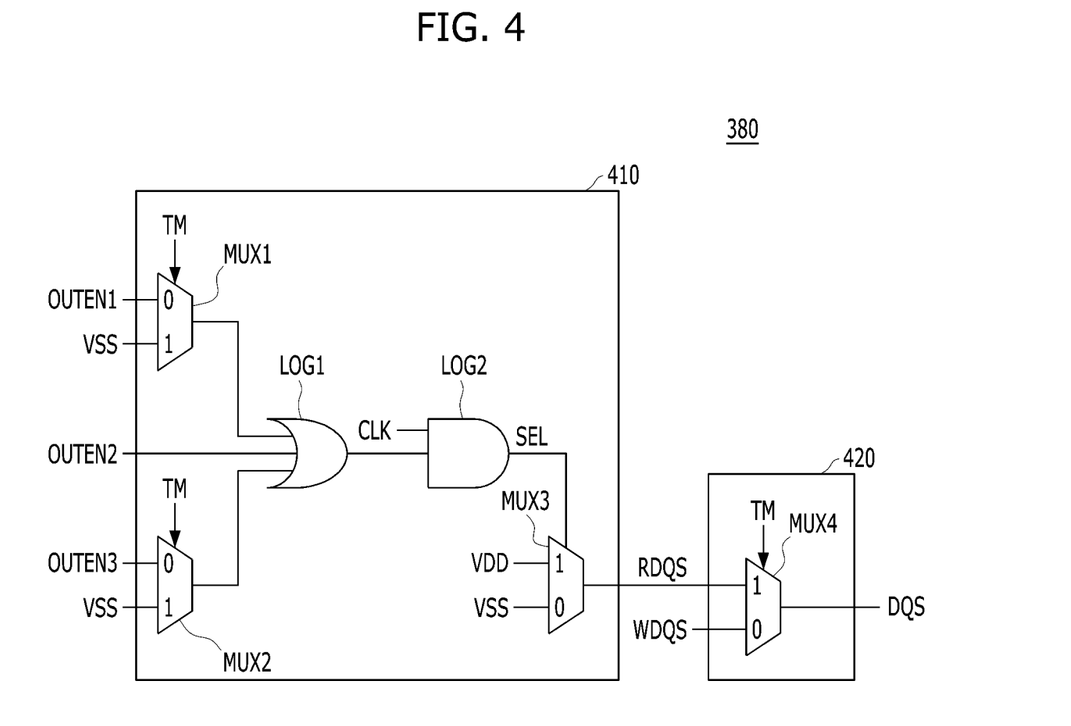
FIG. 4 is a diagram illustrating a data strobe signal generation circuit illustrated in FIG. 3 in accordance with various embodiments of the present invention.

FIG. 4 is a diagram illustrating the data strobe signal generation circuit 380 illustrated in FIG. 3 in accordance with various embodiments of the present invention. The data strobe signal generation circuit 380 may include a read data strobe signal generation unit 410 and a selection unit 420.

The read data strobe signal generation unit 410 may generate the read data strobe signal RDQS based on the first to third output control signals OUTEN1 to OUTEN3 in response to the test mode signal TM. The read data strobe signal generation unit 410 may include first to third multiplexers MUX1 to MUX3 and first and second logic gates LOG1 and LOG2.

The base chip 210 of FIG. 2 may include a decoding circuit (not illustrated) that decodes the inputted command CMD. For example, when the read command RD is inputted, the decoding circuit may decode the read command RD based on the clock signal CLK to generate an output enable signal OUTEN. An input time point of the read command RD may be identified based on the clock signal CLK, and after a time corresponding to a read latency from the identified input time point has elapsed, the output enable signal OUTEN may be activated. The output enable signal OUTEN may be a signal indicating an output timing of data according to a read operation. The output enable signal OUTEN may be shifted to generate the plurality of output control signals OUTEN1 to OUTEN3, and each of the plurality of output control signals OUTEN1 to OUTEN3 may be used to control circuits on the read path of the base chip 210. An operation of the read data strobe signal generation unit 410 according to the first to third output control signals OUTEN1 to OUTEN3 will be described in more detail with reference to FIG. 5.

The selection unit 420 may select one of the read data strobe signal RDQS and the write data strobe signal WDQS in response to the test mode signal TM, and output the selected signal as the internal data strobe signal DQS. The selection unit 420 may include a fourth multiplexer MUX4. When the test mode signal TM is activated, the selection unit 420 may output the read data strobe signal RDQS as the internal data strobe signal DQS, and when the test mode signal TM is deactivated, the selection unit 420 may output the write data strobe signal WDQS as the internal data strobe signal DQS.

Figure 5A:
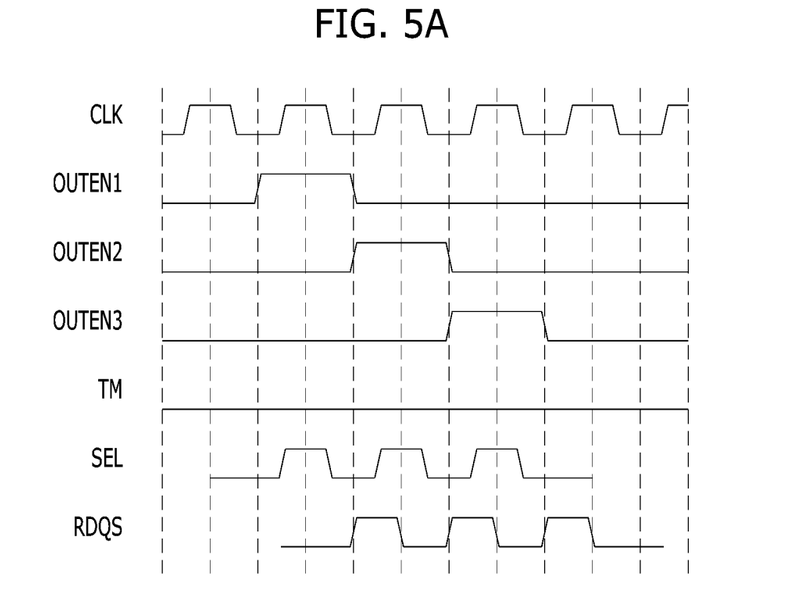
FIG. 5A and FIG. 5B are signal waveform diagrams for describing an operation of a read data strobe signal generation unit illustrated in FIG. 4 in accordance with various embodiments of the present invention.
Figure 5B:
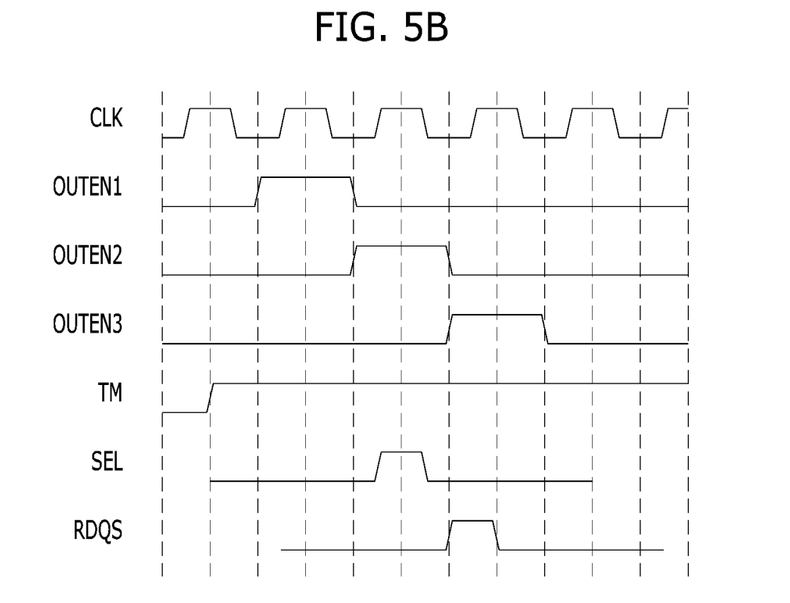

FIG. 5A and FIG. 5B are signal waveform diagrams for describing an operation of the read data strobe signal generation unit 410 illustrated in FIG. 4 in accordance with various embodiments of the present invention. FIG. 5A is a signal waveform diagram in which the read data strobe signal RDQS is generated during a normal read operation, and FIG. 5B is a signal waveform diagram in which the read data strobe signal RDQS is generated during the test read operation.

Referring to FIG. 5A, as the read command RD is inputted, the first to third output control signals OUTEN1 to OUTEN3 may be generated. Among the first to third output control signals OUTEN1 to OUTEN3, the second output control signal OUTEN2 may be activated at a time point corresponding to a read latency from the input of the read command RD. The first and third output control signals OUTEN1 and OUTEN3 may be generated by advancing or delaying the second output control signal OUTEN2 by a predetermined or set time.

When the test mode signal TM is deactivated during the normal read operation, the first and second multiplexers MUX1 and MUX2 of FIG. 4 may select and transmit the first and third output control signals OUTEN1 and OUTEN3, respectively. Accordingly, even though one of the first to third output control signals OUTEN1 to OUTEN3 is at a logic high level, the first logic gate LOG1 may activate its output signal to a logic high level.

The second logic gate LOG2 may combine the output signal of the first logic gate LOG1 and the clock signal CLK to generate a selection signal SEL. Accordingly, the selection signal SEL may be activated to a logic high level in response to the first to third output control signals OUTEN1 to OUTEN3. The third multiplexer MUX3 may alternately output a power supply voltage VDD and a ground voltage VSS when the selection signal SEL is in a high level period and in a low level period, thereby generating the read data strobe signal RDQS.

As a consequence, the read data strobe signal RDQS may have a waveform having three (3) activation periods, that is, an activation period corresponding to an output time point of data, an activation period corresponding to a time point preceding the output time point of data by a predetermined time, i.e., a pre-amble, and an activation period corresponding to a time point following the output time point of data by the predetermined time, i.e., a post-amble. When the read data strobe signal RDQS having such a waveform is used, it is possible to secure a sufficient data margin in a device which receives data.

Referring to FIG. 5B, during the test read operation in accordance with various embodiments of the present invention, the read data strobe signal generation unit 410 may generate the read data strobe signal RDQS in response to only an output time point of data. When the test mode signal TM is activated during the test read operation, the first and second multiplexers MUX1 and MUX2 may block the first and third output control signals OUTEN1 and OUTEN3, respectively, and transmit an output signal having a level of the ground voltage VSS. Accordingly, when the second output control signal OUTEN2 of the first to third output control signals OUTEN1 to OUTEN3 is at a logic high level, the first logic gate LOG1 may activate its output signal to a logic high level.

As a consequence, the selection signal SEL may be activated to a logic high level in response to the second output control signal OUTEN2. The read data strobe signal RDQS may have a waveform that is activated only at the output time point of data.

During the test read operation, the read data strobe signal RDQS may be selected as the internal data strobe signal DQS. The internal data strobe signal DQS may be used to align data fed back via the data pad 31 in parallel. Particularly, when the test register circuit 350 includes the MISR, the test read operation may be performed based on the internal data strobe signal DQS.

Accordingly, during the test read operation, the pre-amble and the post-amble may be removed when the read data strobe signal RDQS is generated, so that it is possible to estimate a result of the preset operation capable of being performed by the MISR. By comparing the estimate and an actual result of the preset operation performed by the MISR during the test read operation, it is possible to confirm defects of the read path and the write path according to whether the estimate matches with the actual result of the preset operation performed by the MISR.

Figure 6:
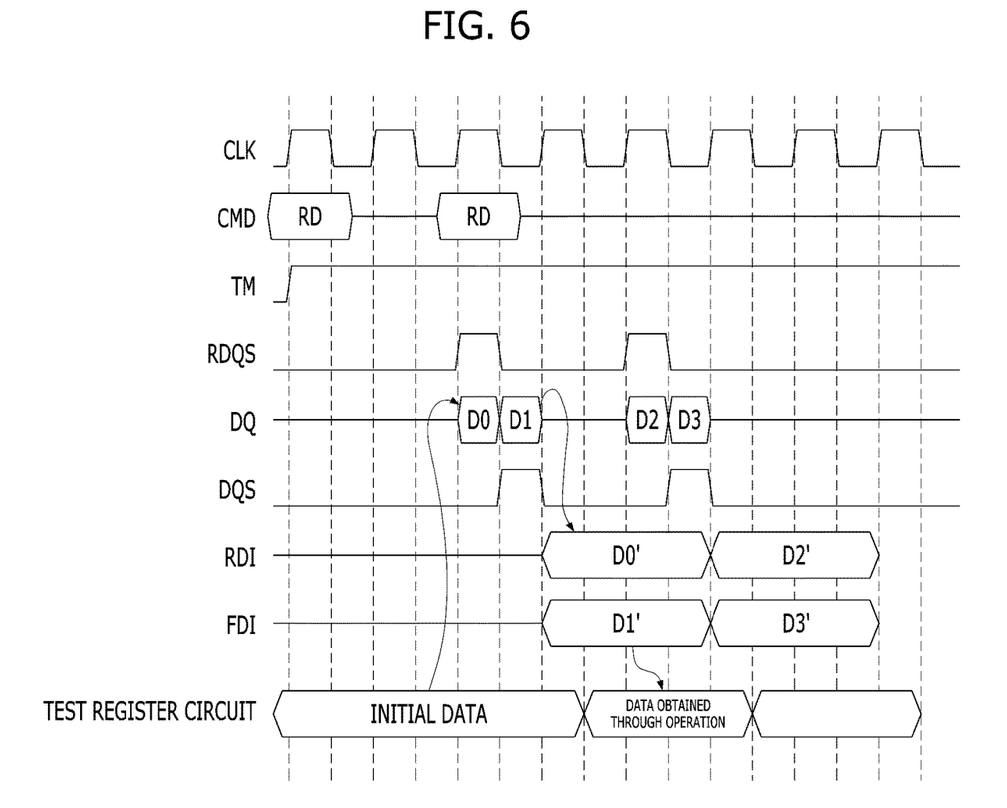
FIG. 6 is a signal waveform diagram for describing an operation of the memory device in accordance with various embodiments of the present invention.

FIG. 6 is a signal waveform diagram for describing an operation of the memory device in accordance with various embodiments of the present invention.

As the test mode signal TM is activated and the read command RD is inputted, the memory device may perform the test read operation. During the test read operation, the initial data stored in the test register circuit 350 of FIG. 3 may be outputted to the read control block RCB of FIG. 3. In response to the read command RD, the read control block RCB may perform the read operation and transmit data, which is outputted from the read register circuit 310, to the data pad 31 of FIG. 3 as read data D0 and D1.

During the test read operation, the data strobe signal generation circuit 380 of FIG. 3 may generate the read data strobe signal RDQS based on the test mode signal TM and the output control signals OUTEN1 to OUTEN3 derived from the read command RD. Furthermore, the data strobe signal generation circuit 380 may generate the internal data strobe signal DQS based on the generated read data strobe signal RDQS.

During the test read operation, the write control block WCB of FIG. 3 may feed back the read data D0 and D1 outputted to the data pad 31. The write control block WCB may align the fed-back data in parallel based on the internal data strobe signal DQS and transmit the aligned data D0' and D1' to the test register circuit 350. The test register circuit 350 may perform a preset operation on the aligned data D0' and D1' and store data obtained through the preset operation.

In the state in which the test mode signal TM has been activated, whenever the read command RD is inputted, data stored in the test register circuit 350 may be continuously outputted to the data pad 31 as read data D2 and D3, may be fed back again, and may be subjected to the preset operation. The test register circuit 350 may output data obtained through the preset operation to the test pad 32 of FIG. 3. Accordingly, it is possible to compare expected data obtained through the normal read operation and data obtained through the preset operation, and to test the circuits on the read/write paths of the memory device by using a limited number of test pads 32.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
  a data pad, and first and second data strobe pads;
  a data strobe signal generation circuit suitable for generating a read data strobe signal, outputting the read data strobe signal to the first data strobe pad, and generating an internal data strobe signal based on the read data strobe signal, during a test read operation;
  an input circuit suitable for feeding back and receiving data outputted to the data pad, during the test read operation;
  an alignment circuit suitable for aligning data received by the input circuit, based on the internal data strobe signal; and
  a test register circuit suitable for performing a preset operation on the data aligned by the alignment circuit and storing data obtained through the preset operation,
  wherein the test register circuit outputs the stored data to a read path during the test read operation.

2. The memory device of claim 1, wherein, during a normal operation, the data strobe signal generation circuit generates the internal data strobe signal based on a write data strobe signal inputted to the second data strobe pad.

3. The memory device of claim 1, wherein, the data strobe signal generation circuit generates the read data strobe signal in response to an input time point of a read command during the test read operation, while generating the read data strobe signal in response to the input time point of the read command and time points which are earlier and later than the input time point by a predetermined time, during a normal operation.

4. The memory device of claim 1, wherein the test register circuit comprises:
  a multiple input signature register (MISR) suitable for performing the preset operation on inputted data and storing data obtained through the preset operation,
  wherein the test register circuit outputs the stored data to a test pad.

5. The memory device of claim 4, further comprising:
  a base chip in which the data pad, the first and second data strobe pads, and the test pad are disposed; and
  a core chip stacked on the base chip and electrically connected to the base chip through a through electrode formed by vertically penetrating an inside of the core chip.

6. A stacked memory device comprising:
  a core chip; and
  a base chip,
  wherein the base chip comprises:
  a read control block suitable for outputting data, which is received from the core chip, to a data pad;
  a test register circuit suitable for outputting stored data to the read control block during a test read operation; and
  a write control block suitable for feeding back data outputted from the read control block to the data pad and transmitting the fed-back data to the test register circuit, during the test read operation.

7. The stacked memory device of claim 6, further comprising:
  a data strobe signal generation circuit suitable for generating a read data strobe signal, outputting the read data strobe signal to a data strobe pad, and generating an internal data strobe signal based on the read data strobe signal, during the test read operation.

8. The stacked memory device of claim 7, wherein the write control block comprises:
  an input circuit suitable for receiving data inputted through the data pad; and
  an alignment circuit suitable for aligning data received by the input circuit, based on the internal data strobe signal,
  wherein the input circuit is activated in response to a test mode signal and feeds back the data, which is outputted to the data pad, to the alignment circuit.

9. The stacked memory device of claim 6, wherein the test register circuit comprises:
  a multiple input signature register (MISR) suitable for performing a preset operation on inputted data and storing data obtained through the preset operation,
  wherein the test register circuit outputs the stored data to a test pad.

10. The stacked memory device of claim 9, wherein the data pad includes a micro bump pad and the test pad includes a direct access pad.

11. A stacked memory device comprising:
a core chip; and
a base chip,
wherein the base chip comprises:
a read control block suitable for outputting data, which is received from the core chip, to a data pad;
a data strobe signal generation circuit suitable for generating a read data strobe signal and generating an internal data strobe signal based on the read data strobe signal, during a test read operation; and
a write control block suitable for feeding back data, which is outputted from the read control block to the data pad, and aligning the fed-back data based on the internal data strobe signal, during the test read operation.

12. The stacked memory device of claim 11, wherein, during a normal operation, the data strobe signal generation circuit outputs the read data strobe signal to a first data strobe pad, and generates the internal data strobe signal based on a write data strobe signal inputted to a second data strobe pad.

13. The stacked memory device of claim 12, wherein the data strobe signal generation circuit generates the read data strobe signal in response to an input time point of a read command, during the test read operation, while generating the read data strobe signal in response to the input time point of the read command and time points which are earlier and later than the input time point by a predetermined time, during the normal operation.

14. The stacked memory device of claim 13, wherein the data strobe signal generation circuit comprises:
a read data strobe signal generation unit suitable for generating the read data strobe signal based on output control signals in response to a test mode signal; and
a selection unit suitable for selecting one of the read data strobe signal and the write data strobe signal in response to the test mode signal, and outputting the selected signal as the internal data strobe signal.

15. The stacked memory device of claim 14, wherein the output control signals are generated by shifting an output enable signal, which is activated after a time corresponding to a read latency from the input time point of the read command, by the predetermined time.

16. The stacked memory device of claim 14, wherein the read data strobe signal generation unit comprises:
a first multiplexer suitable for selecting and outputting a first output control signal and a ground voltage in response to the test mode signal;
a second multiplexer suitable for selecting and outputting a third output control signal and the ground voltage in response to the test mode signal;
a first logic gate suitable for performing a first logic operation on a second output control signal and outputting signals of the first and second multiplexers;
a second logic gate suitable for performing a second logic operation on a clock signal and an output signal of the first logic gate; and
a third multiplexer suitable for selecting and outputting a power supply voltage and the ground voltage in response to an output signal of the second logic gate.

17. The stacked memory device of claim 11, further comprising:
a test register circuit suitable for outputting stored data to the read control block and receiving data aligned by the write control block, during the test read operation.

18. The stacked memory device of claim 17, wherein the test register circuit comprises:
a multiple input signature register (MISR) suitable for performing a preset operation on inputted data and storing data obtained through the preset operation,
wherein the test register circuit outputs the stored data to a test pad.

19. A method for testing a stacked memory device including a core chip having a data storage space, a data pad, a read path for transferring read data from the core chip to the data pad, and a write path for transferring write data from the data pad to the core chip, the method comprising:
inputting a test data to the read path during a read test operation of the stacked memory device;
transferring the test data passing through the read path to the write path via the data pad;
receiving the test data passing through the write path;
performing a preset operation on the received test data;
comparing the test data subjected to the preset operation with a predetermined estimate; and
determining whether or not the read path, the write path or the read and write paths are a fail, based on the comparison between the test data subjected to the preset operation and the predetermined estimate.

20. The method of claim 19, further comprising:
compressing the test data subjected to the preset operation before the comparing step, wherein the comparing and determining steps are performed using the compressed test data by a separate test equipment installed at an outside of the stacked memory device.

* * * * *